United States Patent
Chan et al.

[19]

[11] Patent Number: 6,110,787
[45] Date of Patent: Aug. 29, 2000

[54] METHOD FOR FABRICATING A MOS DEVICE

[75] Inventors: Lap Chan, San Francisco, Calif.; Ting Cheong Ang, Singapore, Singapore; Shyue Pong Quek, Selangor, Malaysia; Sang Yee Loong, Singapore, Singapore

[73] Assignee: Chartered Semiconductor Manufacturing Ltd., Singapore, Singapore

[21] Appl. No.: 09/391,886

[22] Filed: Sep. 7, 1999

[51] Int. Cl.[7] .................................................. H01L 21/336
[52] U.S. Cl. ......................... 438/300; 438/299; 438/303
[58] Field of Search .................................... 438/299, 300, 438/301, 303, 305, 306

[56] References Cited

U.S. PATENT DOCUMENTS 5,539,229   7/1996   Noble, Jr. et al. ........................ 257/301

*Primary Examiner*—Charles Bowers
*Assistant Examiner*—Jack Chen
*Attorney, Agent, or Firm*—George O. Saile; Rosemary L.S. Pike; Stephen Stanton

[57] ABSTRACT

A method of fabricating a MOS device having raised source/drain, raised isolation regions having isolation spacers, and a gate conductor having gate spacers is achieved. A layer of gate silicon oxide is grown over the surface of a semiconductor structure. A polysilicon layer is deposited overlying the gate silicon oxide layer. The polysilicon layer, gate silicon oxide layer and semiconductor structure are patterned and etched to form trenches. The trenches are filled with an isolation material to at least a level even with a top surface of the polysilicon layer to form raised isolation regions. The remaining polysilicon layer is patterned to remove polysilicon adjacent the raised isolation regions forming a gate conductor between the raised isolation regions. The gate conductor and the raised isolation regions having exposed sidewalls. The gate oxide layer between the gate conductor and raised isolation regions is removed. Isolation spacers are formed on the exposed sidewalls of the raised isolation regions and gate spacers are formed on the exposed sidewalls of the gate conductor. A layer of silicon is deposited and patterned to form raised source and drain adjacent the gate spacers with source and drain being doped to form a MOS device.

24 Claims, 2 Drawing Sheets

METHOD FOR FABRICATING A MOS DEVICE

FIELD OF THE INVENTION

The present invention relates generally to methods of forming metal oxide semiconductor (MOS) devices and specifically to those having an elevated source and drain and elevated shallow trench isolation (STI), or raised isolation regions.

BACKGROUND OF THE INVENTION

Raised source/drain (S/D) junctions can provide shallow junctions with low series resistance and the use of raised shallow trench isolation (STI) reduces leakage current through the devices and improves the threshold voltage control.

For example, U.S. Pat. No. 5,915,183 to Gambino et al. describes a process for forming raised source/drain (S/D) junctions using CMP (chemical mechanical polishing) combined with a recess etch of blanket polysilicon. The raised S/D are defined by gate conductors and by raised shallow trench isolation (STI). The process uses a salicide gate conductor, and conventional polysilicon deposition, CMP, and recess steps to form the raised S/D junctions, i.e. form SiN layer; form raised STIs; pattern SiN layer and form gate polysilicon; form raised polysilicon S/D; and form a salicide on the gate polysilicon and raised polysilicon S/D.

U.S. Pat. No. 5,789,792 to Tsutsumi describes a semiconductor device including an element isolating region for isolating a transistor formation region having an MOS transistor from other element formation regions. Two or more raised STI are formed in the element isolating region and are comprised of a first isolating and insulating material. A second insulating material is formed between the raised STI with the upper surfaces of the raised STI and second insulating material being at the same level.

U.S. Pat. No. 5,539,229 to Nobel, Jr. et al. describes a semiconductor structure comprising a transistor having a gate conductor that has first and second edges bounded by raised isolation structures, e.g. STI. A source diffusion is self-aligned to the third edge and a drain diffusion is self-aligned to the fourth edge of the gate electrode.

U.S. Pat. No. 5,918,131 to Hsu et al. describes a method for forming a shallow trench isolation (STI) structure having sidewall spacers that utilizes the early formation of strong oxide spacers so that for any subsequent pad oxide layer or sacrificial oxide layer removal using a wet etching method, the oxide layer adjacent to the substrate will not be overetched to form recesses, thereby preventing the lowering of threshold voltage and the induction of a kink effect.

U.S. Pat. No. 5,882,983 to Gardner et al. describes a method for forming dielectric structures having a relatively low dielectric constant arranged adjacent to the opposed lateral edges of a trench isolation structure.

U.S. Pat. No. 5,721,173 to Yano et al. describes a method of forming a trench isolation structure in which a film is formed of a semiconductor substrate and a trench is formed in the semiconductor substrate through the film. A dielectric material is deposited in the trench and on the film. An etch resistant film is formed on the portions of the dielectric material in the trench and on exposed portions of the film at edge regions of the trench. The dielectric material on the film is selectively removed and the etch resistant film remaining on the dielectric material in the trench is selectively removed.

U.S. Pat. No. 5,786,262 to Jang et al. describes a method of forming a shallow trench isolation using ozone-TEOS as a gap filling material.

SUMMARY OF THE INVENTION

Accordingly, it is an object of the present invention to provide a method of forming a MOS device having a raised shallow trench isolation, or raised isolation regions, with sidewall spacers and a raised source/drain.

Another object of the present invention is to provide a method of forming a raised source/drain, a raised shallow trench isolation, or raised isolation regions, with sidewall spacers, and a gate conductor with gate spacers.

Other objects will appear hereinafter.

It has now been discovered that the above and other objects of the present invention may be accomplished in the following manner. Specifically, a method of fabricating a MOS device having raised source/drain, raised isolation regions having isolation spacers, and a gate conductor having gate spacers is achieved. A layer of gate silicon oxide is grown over the surface of a semiconductor structure. A polysilicon layer is deposited overlying the gate silicon oxide layer. The polysilicon layer, gate silicon oxide layer and semiconductor structure are patterned and etched to form trenches. The trenches are filled with an isolation material to at least a level even with a top surface of the polysilicon layer to form raised isolation regions. The remaining polysilicon layer is patterned to remove polysilicon adjacent the raised isolation regions forming a gate conductor between the raised isolation regions. The gate conductor and the raised isolation regions having exposed sidewalls. The gate oxide layer between the gate conductor and raised isolation regions is removed. Isolation spacers are formed on the exposed sidewalls of the raised isolation regions and gate spacers are formed on the exposed sidewalls of the gate conductor. A layer of silicon is deposited and patterned to form raised source and drain adjacent the gate spacers with source and drain being doped to form a MOS device. It is noted that the gate oxide under the gate conductor is a portion of the original gate oxide layer—no additional steps, i.e. removal of all of gate oxide and regrowing gate oxide under gate conductor, are required.

BRIEF DESCRIPTION OF THE DRAWINGS

The features and advantages of the method of fabricating a MOS device having a raised source/drain, and raised isolation regions having sidewall spacers according to the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Figure 1:
FIGS. 1 through 6 schematically illustrate in cross-sectional representation a preferred embodiment of the present invention.

Accordingly as shown in FIG. 1, starting semiconductor structure 10 preferably includes a upper layer of silicon and is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure"

is meant to include devices formed within a semiconductor wafer and the layers overlying the wafer. Unless otherwise specified, all structures, layers, etc. may be formed or accomplished by conventional methods known in the prior art.

Figure 2:
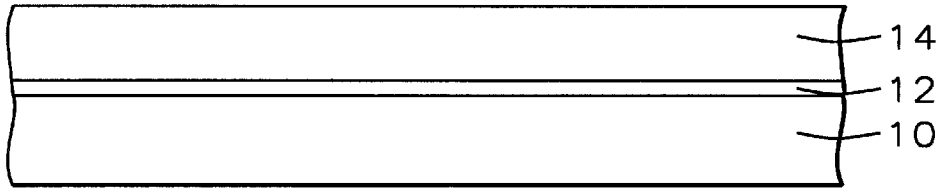

As shown in FIG. 2, gate silicon oxide layer 12 (preferably from about 1 to 20 nm thick and more preferably about 3 nm thick) is formed over the surface of semiconductor structure 10 with polysilicon layer 14 (preferably from about 150 to 300 nm thick and more preferably about 200 nm thick) formed overlying gate silicon oxide layer 12.

Figure 3:
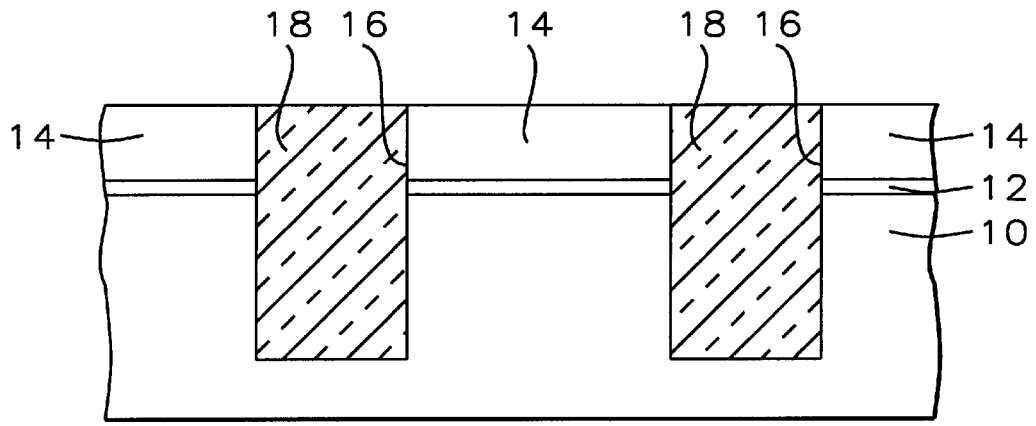

Referring to FIG. 3, trenches 16 are etched through poly layer 14, gate oxide layer 12 and into semiconductor structure 10 (preferably to a depth of from about 400 to 800 nm, and typically about 550 nm) preferably using suitable lithography, e.g. photo resist layers with openings, and reactive ion etching (RIE) techniques. Trenches 16 are filled with an appropriate isolation material, such as $Si_3N_4$, SiON, or more preferably $SiO_2$, deposited by low pressure chemical vapor deposition (LPCVD) or other suitable techniques at least level with a top surface of poly layer 14. The isolation material is then patterned as necessary, preferably by chemical mechanical polishing (CMP), to form shallow isolation trenches (STI), or raised isolation regions, 18.

Figure 4:
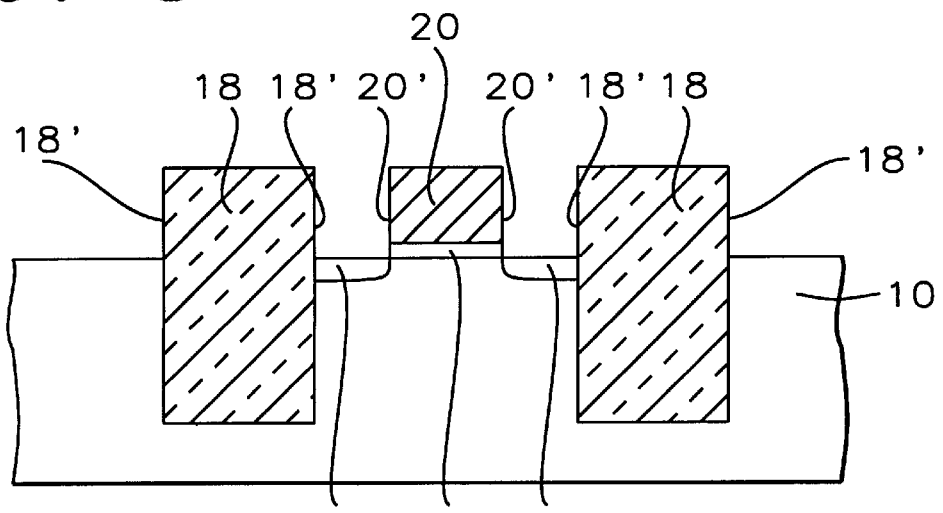

As shown in FIG. 4, the remaining poly layer 14 is patterned to remove poly layer 14 adjacent raised isolation regions 18 to form gate conductor 20 between raised isolation regions 18. Gate oxide layer 12 between gate conductor 20 and raised isolation regions 18 is then removed leaving gate oxide layer 12' underneath gate conductor 20. It is noted that 12' is a portion of the original gate oxide layer 12—no additional steps are required, e.g. removal of all of gate oxide 12 and regrowing gate oxide 12' under gate conductor 20. Gate conductor 20 has exposed gate sidewalls 20' and raised isolation regions 18 have exposed sidewalls 18'. Low doped source/drain (LDD) ion implants, or extension ion implant diffusions, 22 for the source/drain junctions may be performed prior to the isolation spacer formation.

Figure 5:
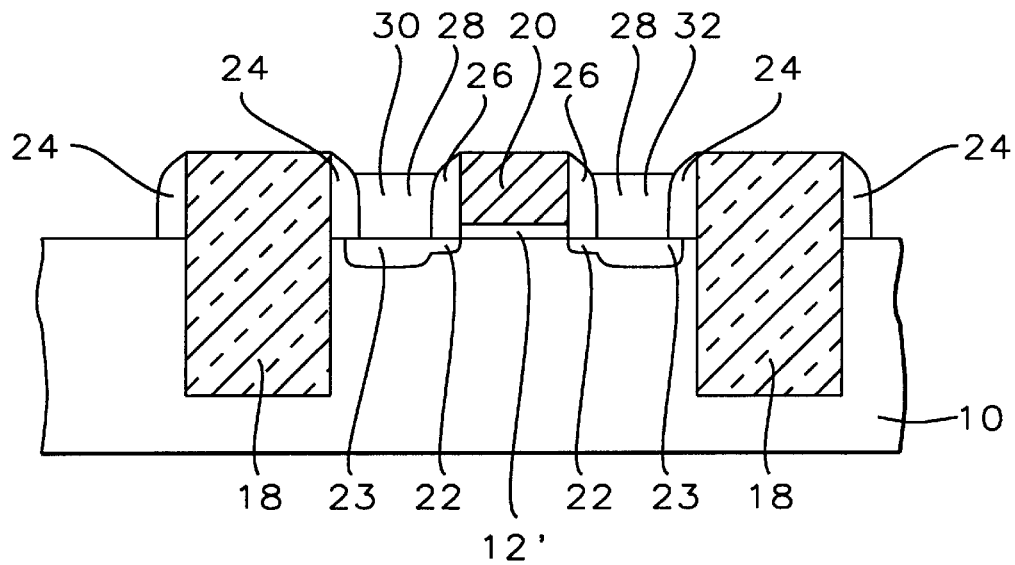

As shown in FIG. 5, isolation spacers 24 are formed adjacent raised isolation regions 18 on exposed sidewalls 18', and gate spacers 26 are formed adjacent gate conductor 20 on exposed gate sidewalls 20'. Isolation and gate spacers 24, 26, respectively, may be formed of SiON and SiN and most preferably $SiO_2$. Spacers 24, 26 can be formed by LPCVD depositing from about 60 to 200 nm, and more preferably about 100 nm $Si_3N_4$, followed by an reactive ion etch (RIE) spacer etch. Isolation spacers 24 are from about 50 to 160 nm wide, and more preferably about 80 nm wide, and gate spacers 26 are from about 50 to 160 nm wide, and more preferably about 80 nm wide.

Any oxide or contamination on the substrate is removed, preferably by using a wet etch of dilute HF.

Next, intrinsic epitaxial silicon, amorphous silicon, or polysilicon 28 is selectively deposited preferably by selective epitaxial growth (SEG) to a thickness of from about 150 to 300 nm and more preferably about 200 nm which will form raised source/drain (S/D) 30, 32. Also, intrinsic epitaxial silicon, amorphous silicon, or polysilicon 28 may be deposited by selective LPCVD (low pressure chemical vapor deposition). Intrinsic silicon 28/raised source/drain (S/D) 30, 32 is recessed below the top surfaces of raised isolation regions 18 and gate conductor 20 by from 100 to 150 nm and more preferably about 130 nm.

Epitaxial silicon/amorphous/polysilicon 28 may be doped in situ as grown, or the recessed epitaxial silicon/polysilicon 28 may be doped by other conventional techniques such as ion implantation (at an energy from about 10 to 100 keV and at a dose of from about 1 E 15 to 5 E 15 atoms/cm$^2$ and more preferably at an energy from about 30 to 70 keV and at a dose of from about 3 E 15 to 5 E 15 atoms/cm$^2$) and annealing to form doped source/drain 30, 32. Source/drain regions 23 are preferably formed by ion implantation after the deposition of epitaxial silicon/amorphous/polysilicon 28. Also, source/drain regions 23 may be formed by diffusion from source/drain 30, 32. Source/drain regions 23 are formed below source/drain 30, 32 and outboard low doped source/drain (LDD) ion implants, or extension ion implant diffusions, 22.

Figure 6:
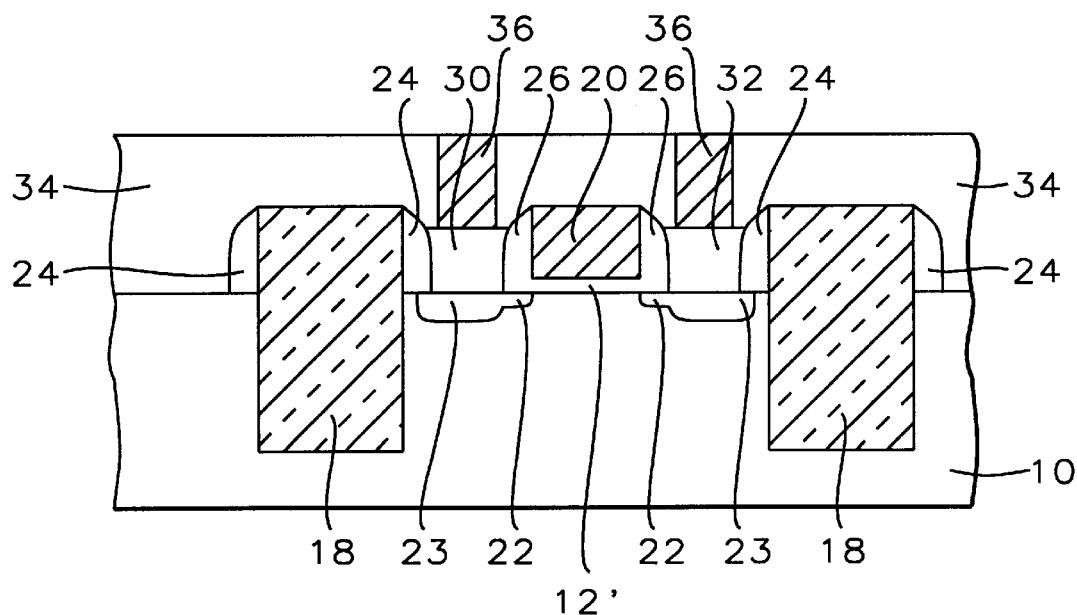

As shown in FIG. 6, conventional methods may be used to form interlevel dielectric layer (ILD) 34 over the MOS device of the present invention with ILD contacts 36 (comprised of tungsten, e.g.) connected to source/drain 30, 32.

While particular embodiments of the present invention have been illustrated and described, it is not intended to limit the invention, except as defined by the following claims.

We claim:

1. A method of fabricating a MOS device, comprising the steps of:

providing a semiconductor structure;

growing a gate oxide layer over said semiconductor structure;

depositing a polysilicon layer over said gate oxide layer;

patterning and etching said polysilicon layer, said gate oxide layer, and said semiconductor structure to form trenches;

filing said trenches with an isolation material to at least a level even with a top surface of said patterned polysilicon layer to form raised isolation regions;

patterning said patterned polysilicon layer to remove a portion of said polysilicon layer adjacent said raised isolation regions to form a gate conductor between said raised isolation regions; said gate conductor and said raised isolation regions having exposed sidewalls;

removing said gate oxide layer between said gate conductor and said raised isolation regions;

forming lightly doped source and drain implants by ion implanting into said semiconductor structure;

forming isolation spacers on said exposed sidewalls of said raised isolation regions and gate spacers on said exposed sidewalls of said gate conductor;

selectively depositing an undoped silicon film between said gate conductor and said raised isolation regions adjacent said isolation and gate spacers to form raised source and drain areas; said raised source and drain areas composed of raised epitaxial silicon; and doping said raised source and drain areas by implanting ions only into said raised source and drain areas; and forming source/drain regions in said semiconductor structure by implanting ions completely through said doped raised source and drain areas and only into said semiconductor structure.

2. The method of claim 1, wherein said isolation material is $SiO_2$.

3. The method of claim 1,
wherein said doping said raised source and drain areas are formed by ion implanting at an energy of from about 10 to 100 keV and at a dose of from about 1 E 15 to 5 E 15 atoms/cm$^2$.

4. The method of claim 1, wherein said gate oxide layer is from about 1 to 20 nm thick.

5. The method of claim 1, wherein said polysilicon layer is from about 150 to 300 nm thick.

6. The method of claim 1, wherein said trenches are from about 400 to 800 nm within said semiconductor structure.

7. The method of claim 1, wherein said trenches are from about 525 to 575 nm within said semiconductor structure.

8. The method of claim 1, wherein said isolation spacers are from about 60 to 200 nm wide and said gate spacers are from about 50 to 160 nm wide.

9. The method of claim 1, wherein said isolation spacers are from about 90 to 110 nm wide and said gate spacers are from about 70 to 90 nm wide.

10. A method of fabricating a MOS device, comprising the steps of:

providing a semiconductor structure;

growing a gate oxide layer over said semiconductor structure;

deposing a polysilicon layer over said gate oxide layer;

patterning and etching said polysilicon layer, said gate oxide layer, and said semiconductor structure to form trenches;

filling said trenches with an isolation material to at least a level even with a top surface of said patterned polysilicon layer to form raised isolation regions;

patterning said patterned polysilicon layer to remove a portion of said polysilicon layer adjacent said rained isolation regions to form a gate conductor between said raised isolation regions; said gate conductor and said raised isolation regions having exposed sidewalls;

removing said gate oxide layer between said gate conductor and said raised isolation regions;

forming extension ion implant diffusions in said semiconductor structure adjacent said gate conductor by ion implanting into said semiconductor structure;

forming isolation spacers on said exposed sidewalls of said raised isolation regions and gate spacers on said exposed sidewalls of said gate conductor;

selectively depositing an undoped silicon film between said gate conductor and said raised isolation regions adjacent said isolation and gate spacers to form raised source and drain areas; said raised source and drain areas comprised of raised epitaxial silicon;

doping said raised source and drain areas by implanting ions only into said raised source and drain areas; and forming source/drain regions in said semiconductor structure by implanting ions completely through said doped raised source and drain areas and only into said semiconductor structure.

11. The method of claim 10, wherein said isolation material is $SiO_2$.

12. The method of claim 10, wherein said raised source and drain areas are doped by ion implanting at an energy of from about 10 to 100 keV and at a dose of from about 1 E 15 to 5 E 15 atoms/cm$^2$.

13. The method of claim 10, wherein said gate oxide layer is from about 1 to 20 nm thick.

14. The method of claim 10, wherein said polysilicon layer is from about 150 to 300 nm thick.

15. The method of claim 10, wherein said trenches are from about 400 to 800 nm within said semiconductor structure.

16. The method of claim 10, wherein said trenches are from about 525 to 575 nm within said semiconductor structure.

17. The method of claim 10, wherein said isolation spacers are from about 60 to 200 nm wide and said gate spacers are from about 50 to 160 nm wide.

18. The method of claim 10, wherein said isolation spacers are from about 90 to 110 nm wide and said gate spacers are from about 70 to 90 nm wide.

19. A method of fabricating a MOS device, comprising the steps of:

providing a semiconductor structure;

growing a gate oxide layer from about 1 to 20 nm thick over said semiconductor structure;

depositing a polysilicon layer from about 150 to 300 nm thick over said gate oxide layer;

patterning and etching said polysilicon layer, said gate oxide layer, and said semiconductor structure to form trenches;

filling said trenches with an isolation material to at least a level even with a top surface of said patterned polysilicon layer to form raised isolation regions;

patterning said patterned polysilicon layer to remove a portion of said polysilicon layer adjacent said raised isolation regions to form a gate conductor between said raised isolation regions; said gate conductor and said raised isolation regions having exposed sidewalls;

removing said gate oxide layer between said gate conductor and said raised isolation regions;

forming extension ion implant divisions in said semiconductor structure adjacent said gate conductor;

forming isolation spacers on said exposed sidewalls of said raised isolation regions and gate spacers on said exposed sidewalls of said gate conductor;

selectively depositing an undoped silicon film, by a selective epitaxial growth (SEG) process, between said gate conductor and said raised isolation regions adjacent said isolation and gate spacers to form raised source and drain areas; said raised source and drain areas composed of raised epitaxial silicon;

doping said raised source and drain areas by implanting ions only into said raised source and drain areas; and forming source/drain regions in said semiconductor structure by implanting ions completely through said SEG formed doped raised source and drain areas and only into said semiconductor structure.

20. The method of claim 19, wherein said trenches are from about 400 to 800 nm within said semiconductor structure.

21. The method of claim 19, wherein said trenches are from about 525 to 575 nm within said semiconductor structure.

22. The method of claim 19, wherein said isolation spacers are from about 60 to 200 nm wide and said gate spacers are from about 50 to 160 nm wide.

23. The method of claim 19, wherein said isolation spacers are from about 90 to 110 nm wide and said gate spacers are from about 70 to 90 nm wide.

24. A method of fabricating a MOS device, comprising the steps of:

providing a semiconductor structure;

growing a gate oxide layer from about 1 to 20 nm thick over said semiconductor structure;

depositing a polysilicon layer from about 150 to 300 nm thick over said gate oxide layer;

patterning and etching said polysilicon layer, said gate oxide layer, and said semiconductor structure to form trenches;

filling said trenches with an isolation material to at least a level even with a top surface of said patterned polysilicon layer to form raised isolation regions;

patterning said patterned polysilicon layer to remove a portion of said polysilicon layer adjacent said raised isolation regions to form a gate conductor between said raised isolation regions; said gate conductor and said raised isolation regions having exposed sidewalls;

removing said gate oxide layer between said gate conductor and said raised isolation regions;

forming lightly doped source and drain implants by implanting ions into said semiconductor structure;

forming isolation spacers on said exposed sidewalls of said raised isolation regions and gate spacers on said exposed sidewalls of said gate conductor;

selectively depositing an undoped silicon film by a selective epitaxial growth (SEG) process between said gate conductor and said raised isolation regions adjacent said isolation and gate spacers to form raised source and drain areas; said raised source and drain areas composed of raised epitaxial silicon;

doping said raised source and drain areas by implanting ions only into said raised source and drain areas; and forming source/drain regions in said semiconductor structure by implanting ions completely through said SEG formed doped raised source and drain areas and only into said semiconductor structure.

* * * * *